(12) United States Patent
Babcock et al.

(10) Patent No.: US 9,007,084 B2
(45) Date of Patent: Apr. 14, 2015

(54) SUPPORT STRUCTURE FOR INSTALLATION OF A COMPONENT ASSEMBLY HOUSED IN A ROTATING, TRANSLATING CARRIAGE CHASSIS

(75) Inventors: Raymond F. Babcock, Rochester, MN (US); Michael A. Boraas, Rochester, MN (US); Matthew A. Butterbaugh, Rochester, MN (US); Jeffrey L. Justin, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1187 days.

(21) Appl. No.: 12/815,755

(22) Filed: Jun. 15, 2010

(65) Prior Publication Data

US 2011/0304344 A1    Dec. 15, 2011

(51) Int. Cl.
*G01R 31/00* (2006.01)
*G01R 31/28* (2006.01)

(52) U.S. Cl.
CPC .................................. *G01R 31/2808* (2013.01)

(58) Field of Classification Search
None
See application file for complete search history.

(56) References Cited

U.S. PATENT DOCUMENTS

| | | | |
|---|---|---|---|
| 4,357,062 A | 11/1982 | Everett | |
| 4,751,457 A | 6/1988 | Veenendaal | |
| 5,003,254 A | 3/1991 | Hunt et al. | |
| 5,052,728 A * | 10/1991 | Fukumoto | 292/106 |
| 5,150,041 A | 9/1992 | Eastin et al. | |
| 5,346,354 A * | 9/1994 | Hellstrom | 414/430 |
| 5,436,567 A | 7/1995 | Wexler et al. | |
| 5,609,107 A * | 3/1997 | Viola et al. | 105/77 |
| 5,768,104 A * | 6/1998 | Salmonson et al. | 361/704 |
| 6,058,010 A | 5/2000 | Schmidt et al. | |
| 6,771,090 B2 | 8/2004 | Harris et al. | |
| 6,788,544 B1 * | 9/2004 | Barsun et al. | 361/727 |
| 6,864,698 B2 | 3/2005 | Mirkhani et al. | |
| 6,876,211 B2 | 4/2005 | Chung et al. | |
| 7,011,031 B1 * | 3/2006 | Bradley | 112/119 |
| 7,400,135 B1 | 7/2008 | Bartholomew et al. | |
| 7,757,506 B2 * | 7/2010 | Ellsworth et al. | 62/259.2 |

* cited by examiner

*Primary Examiner* — Arleen M Vazquez
*Assistant Examiner* — Feba Pothen
(74) *Attorney, Agent, or Firm* — Edward J. Lenart; Mark McBurney; Biggers Kennedy Lenart Spraggins LLP

(57) ABSTRACT

A support structure for installation of a component assembly housed in a rotating, translating carriage chassis, the support structure including: a stationary rail that includes a shaft extruding perpendicular to the stationary rail; a rotating rail adapted to receive a carriage chassis rail, the rotating rail parallel to the stationary rail when the rotating rail is in a non-rotated position, the rotating rail including a shaft receptacle that receives the shaft, the rotating rail configured to rotate about the shaft and relative to the stationary rail; and a translation mechanism attached to the rotating rail, the translation mechanism enabling the carriage chassis rail to translate parallel to and along the rotating rail.

8 Claims, 3 Drawing Sheets

SUPPORT STRUCTURE FOR INSTALLATION OF A COMPONENT ASSEMBLY HOUSED IN A ROTATING, TRANSLATING CARRIAGE CHASSIS

STATEMENT REGARDING FEDERALLY SPONSORED RESEARCH OR DEVELOPMENT

This invention was made with Government support under Contract No. H98230-08-C-1295, which was awarded by the Maryland Procurement Office. The Government has certain rights in this invention.

BACKGROUND OF THE INVENTION

1. Field of the Invention

The field of the invention is data processing, or, more specifically, support structures for installation of a component assembly housed in a rotating, translating carriage chassis.

2. Description of Related Art

In development environments computer components, electronics, and other electrical components from time to time are tested and debugged. One such environment, for example, includes support structure that provides power, testing equipment, and various docking or mounting options for components under test. In this example environment, components under test may be mounted or installed in the support structure by means of a carriage chassis. Such components under test may comprise an assembly of two 'cards' each of which includes a plurality of printed circuit boards (PCBs) with electrical components and a liquid-cooled cold plate that provides cooling to the electrical components of the PCBs. This cold plate/card assembly may be assembled with one card on either side of the cold plate. When installed in a support structure, the one of the cards of the card cold plate/card assembly typically faces the ground and is generally inaccessible by personnel handling, or testing, the assembly. In addition, this cold plate/card assembly may be very large and very heavy, in some cases, several hundred pounds. Handling such an assembly and accessing all portions of the assembly is oftentimes a difficult and cumbersome task.

SUMMARY OF THE INVENTION

Support structures for installation of a component assembly housed in a rotating, translating carriage chassis are disclosed. The support structure includes a stationary rail. The stationary rail includes a shaft extruding perpendicular to the stationary rail. The support structure also includes a rotating rail adapted to receive a carriage chassis rail. The rotating rail is parallel to the stationary rail when the rotating rail is in a non-rotated position. The rotating rail includes a shaft receptacle that receives the shaft. The rotating rail is configured to rotate about the shaft and relative to the stationary rail. The support structure also includes a translation mechanism attached to the rotating rail. The translation mechanism enables the carriage chassis rail to translate parallel to and along the rotating rail.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
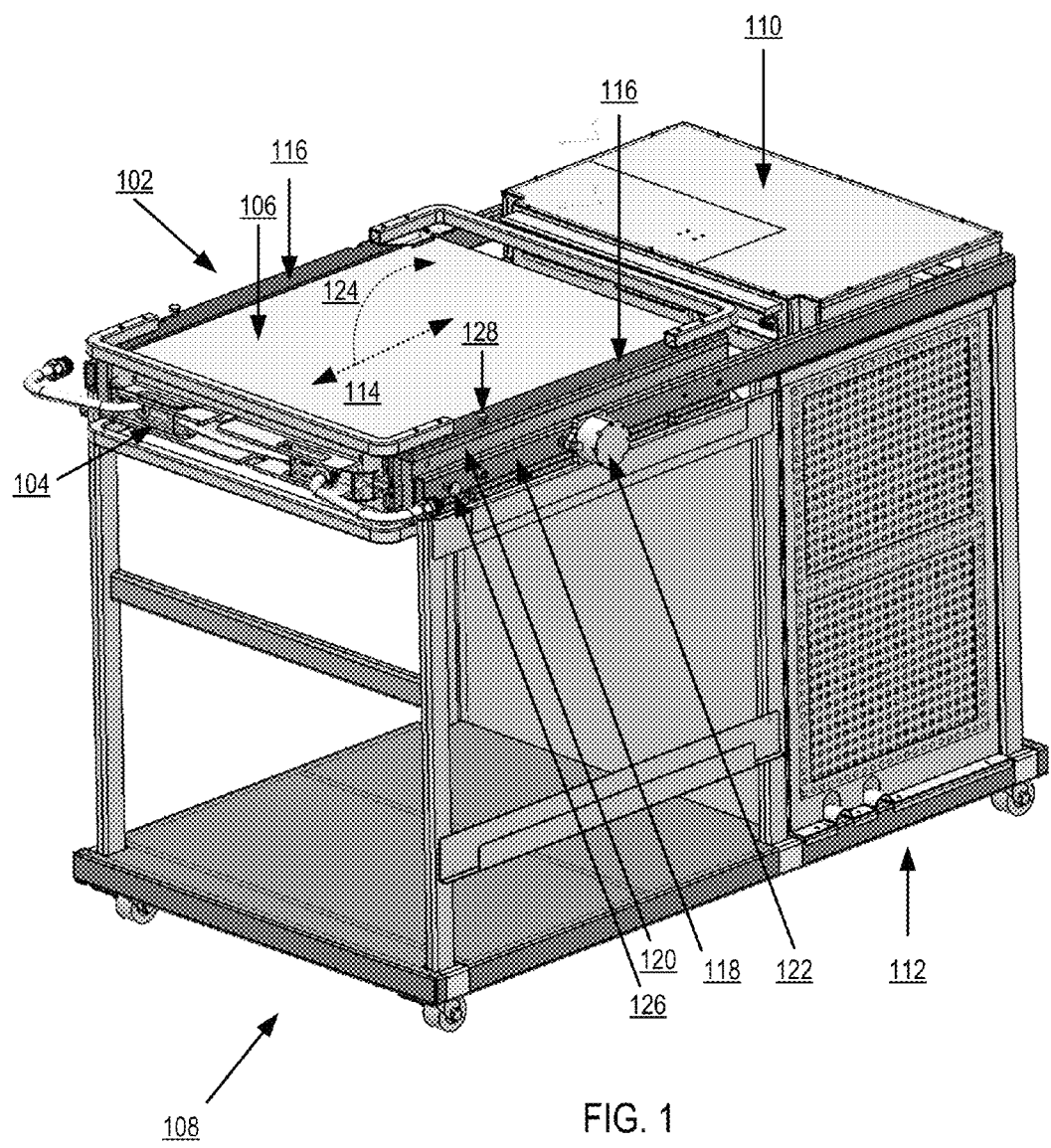
FIG. 1 sets forth a line drawing of an exemplary system that includes a support structure in which is installed a component assembly housed in a rotating, translating carriage chassis in accordance with embodiments of the present invention.

Exemplary support structures for installation of a component assembly housed in a rotating, translating carriage chassis in accordance with embodiments of the present invention is disclosed with reference to the accompanying drawings, beginning with FIG. 1. FIG. 1 sets forth a line drawing of an exemplary system that includes a support structure (108) in which is installed a component assembly (104) housed in a rotating, translating carriage chassis (102) in accordance with embodiments of the present invention. The example support structure (108) of FIG. 1 may be implemented as a test fixture in which components are tested, debugged, and the like. The example support structure (108) includes rack (112) that includes a plurality of slots in which may be installed computers, testing apparatus, power supplies, routers, switches, hard drives, and so on as will occur to readers of skill in the art.

The example support structure (108) of FIG. 1 also includes a power connector housing (110) which includes, in turn, a power connector. The power connector housing (110) may also include a power supply or other electrical equipment. The power connector is adapted to couple to a component assembly (104) installed in the translating, rotating carriage chassis (102) and provide power to the component assembly (104).

The example support structure (108) of FIG. 1 includes a stationary rail (118). In fact, the support structure (108) includes a pair of such rails (118), one position on each side of the structure (108) and parallel to one another. The stationary rail (118) includes a shaft (not shown in FIG. 1) extruding perpendicular to the stationary rail.

The example support structure (108) of FIG. 1 also includes a rotating rail (120), in a non-rotated position, parallel to the stationary rail (118). Like the stationary rail (118), in this example the support structure (108) includes a pair of rotating rails, parallel to one another and positioned on opposite sides of the support structure (108). In the example of FIG. 1, each rotating rail (120) is adapted to receive a carriage chassis rail (116).

The carriage chassis rail (116) is a member of the rotating, translating carriage chassis (102). The carriage chassis (102) is configured to receive a component assembly. The carriage chassis (102) may be configured to receive a component assembly by means of a channel formed in the carriage chassis rails (120), a sliding mechanism fastened to the carriage chassis rails, bearings, or the like. In the example of FIG. 1, a component assembly (104) is installed in the carriage chassis (102). Such a component assembly may include one or more 'card,' each of which includes a number of printed circuit boards or other electrical components. The component assembly may also include a liquid-cooled cold plate. The component assembly (104), in this example, includes two cards containing a number of PCBs and a liquid-cooled cold plate. One card is located on a top side of the cold plate and the other card is located on the bottom side of the cold plate. Although the component assembly (104) in the example of FIG. 1 is described as comprising a card/cold plate assembly, readers of skill in the art will recognize that any type of component assembly may be housed in a carriage chassis for installation in a support structure configured in accordance with embodiments of the present invention.

To protect personnel handling the component assembly (104) from high voltage connections, safety covers (106) are also installed in example carriage chassis (102) of FIG. 1. The safety covers (106), one on top and one on bottom (not seen in this view), may be installed in the carriage chassis (102) in a similar manner as the component assembly.

In the example support structure (108) of FIG. 1, each rotating rail (120) also includes a shaft receptacle (not shown in FIG. 1) that receives the shaft extruding from and perpendicular to the stationary rail (118). Each rotating rail (120) is configured to rotate, in the direction (124) depicted here, about the shaft and relative to the stationary rail (118).

The example support structure (108) of FIG. 1 also includes a translation mechanism (not shown in FIG. 1) attached to the rotating rail (120). The translation mechanism enables the carriage chassis rail to translate parallel to and along the rotating rail (120) in the direction (114) depicted in FIG. 1.

The carriage chassis (102) in the example of FIG. 1 may translate parallel to the rotating rail (120) toward and away from the power connector and connector housing (110) and may rotate with the rotating rail (120) about the shaft. That is, the operation of the stationary and rotating rails enable the carriage chassis to translate and rotate when installed in the support structure (108).

The support structure (108) in the example of FIG. 1 also includes a rotation interlock (126) configured to prevent rotation of the rotating rail (120) when the interlock is engaged. A rotation interlock (126) useful in support structures for installation of component assemblies housed in rotating, translating carriage chassis in accordance with embodiments of the present invention may be implemented as a spring plunger, a rod, a bolt, or some other form of mechanical interlock as will occur to readers of skill in the art. In the example of FIG. 1, the rotation interlock is a spring plunger that may be engaged through the stationary rail (118) and into a receptacle of the rotating rail (120). Once engaged, the rotating rail (120) is prevented from rotation.

The support structure (108) in the example of FIG. 1 also includes a translation interlock (128) configured to prevent translation of the carriage chassis rail when the interlock is engaged. Like the rotation interlock, the translation interlock may be implemented in a variety of ways. Here, the translation interlock (128) is implemented as a spring plunger that may be engaged through the carriage chassis rail (116) into a receptacle of the rotating rail (120). Once engaged, the carriage chassis rail (116) is prevented from translating along the rotating rail (120).

The support structure (108) in the example of FIG. 1 also includes a rotary damper (122) operatively coupled to the stationary rail (118) and the rotating rail (120). The rotary damper (122) is configured to control speed of rotation of the rotating rail (120). The rotary damper may be implemented in various ways, including for example, as a hydraulic damper. In fact, in some embodiments, a shaft of such a hydraulic damper is the shaft extruding from the stationary rail (118) into the rotating rail (120), about which the rotating rail (120) rotates.

Figure 2:
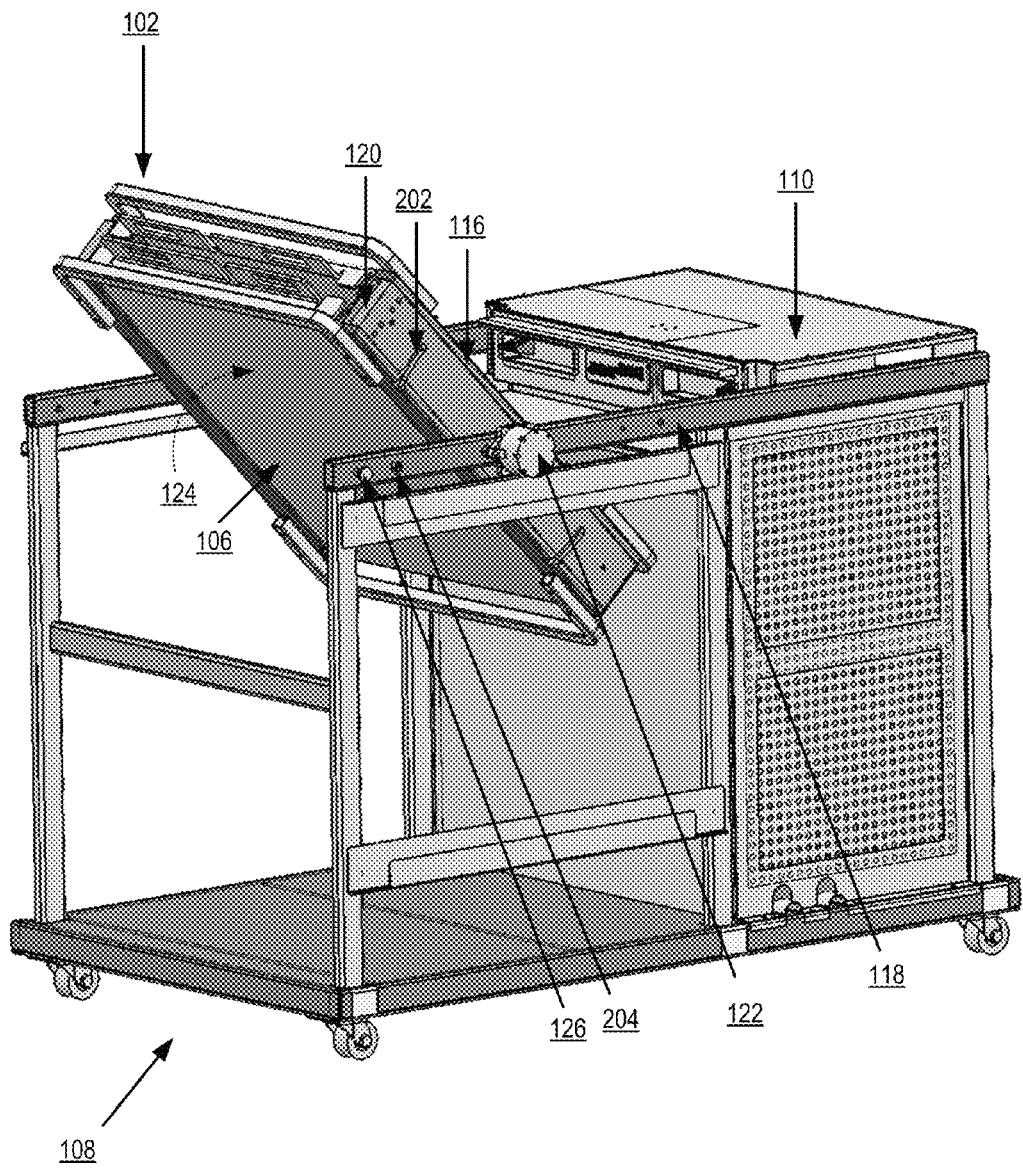
FIG. 2 also sets forth a line drawing of an exemplary system that includes a support structure in which is installed a component assembly housed in a rotating, translating carriage chassis in accordance with embodiments of the present invention.

FIG. 2 also sets forth a line drawing of an exemplary system that includes a support structure (108) in which is installed a component assembly (104) housed in a rotating, translating carriage chassis (102) in accordance with embodiments of the present invention. The system of FIG. 2 is similar to the system of FIG. 1 including as it does a support structure (108) that, in turn, includes: a stationary rail (118), a rotating rail (120) adapted to receive a carriage chassis rail (116) and a translation mechanism attached to the rotating rail (120).

The system of FIG. 2 differs from the system of FIG. 1, however, in that in the system of FIG. 2, the rotating rail (120) is in a rotated position, along with the carriage chassis rail (116) and thus the carriage chassis (102). When in a rotated position such as the position depicted in the example of FIG. 2, personnel handling a component assembly installed in the carriage chassis (102) may access the bottom portion, that portion parallel to the ground when in a non-rotated position, of the component assembly.

In the example of FIG. 2, the rotation interlock (126) is not engaged, enabling the rotating rail (120) to rotate freely. By contrast, the translation interlock (not shown here) is engaged. If not engaged, in this rotated position, the carriage chassis rail (116), and thus the carriage chassis (102), would be free to translate parallel to and along the rotating rail (120). In some embodiments, the component assembly may be very heavy, hundreds of pounds. In such an embodiment, gravity and the weight of the component assembly would cause the carriage chassis to translate toward the ground. To prevent such movement, the translation interlock may be engaged prior to rotating the carriage chassis (102), carriage chassis rail (116), and the rotating rail (120) of the support structure.

In the example support structure (108) of FIG. 2, the stationary rail (118) also includes a rotation limiting member (204). The rotation limiting member (204) extrudes perpendicular to the stationary rail (118). In this example, the member (204) extrudes on the interior of the rail (118). The rotating rail (116) in the example of FIG. 2 also includes a channel (202) that receives the rotation limiting member. The channel (202) is configured to limit the rotation of the rotating rail (120) between a non-rotated position and a final position. The stationary rail (118) may more than one member (204), and the rotating rail (120) may include more than one channel (202). In this example, the rotating rail (120) includes two channels (202) and the stationary rail includes only one limiting member (126). The limiting member (126) and channel (202) in the example support structure (108) of FIG. 2 operate in conjunction with one another to limit rotation of the rotating rail (120) in this way: when rotating in a direction opposite of the direction (124), the rotating rail (120) in the example of FIG. 2, may rotate effectively no further than aligning in parallel with the stationary rail (118). The lack of a second limiting member, enables the rotating rail to rotate in the direction (124) depicted in FIG. 2, practically 180 degrees from its initial, non-rotated position.

Figure 3:
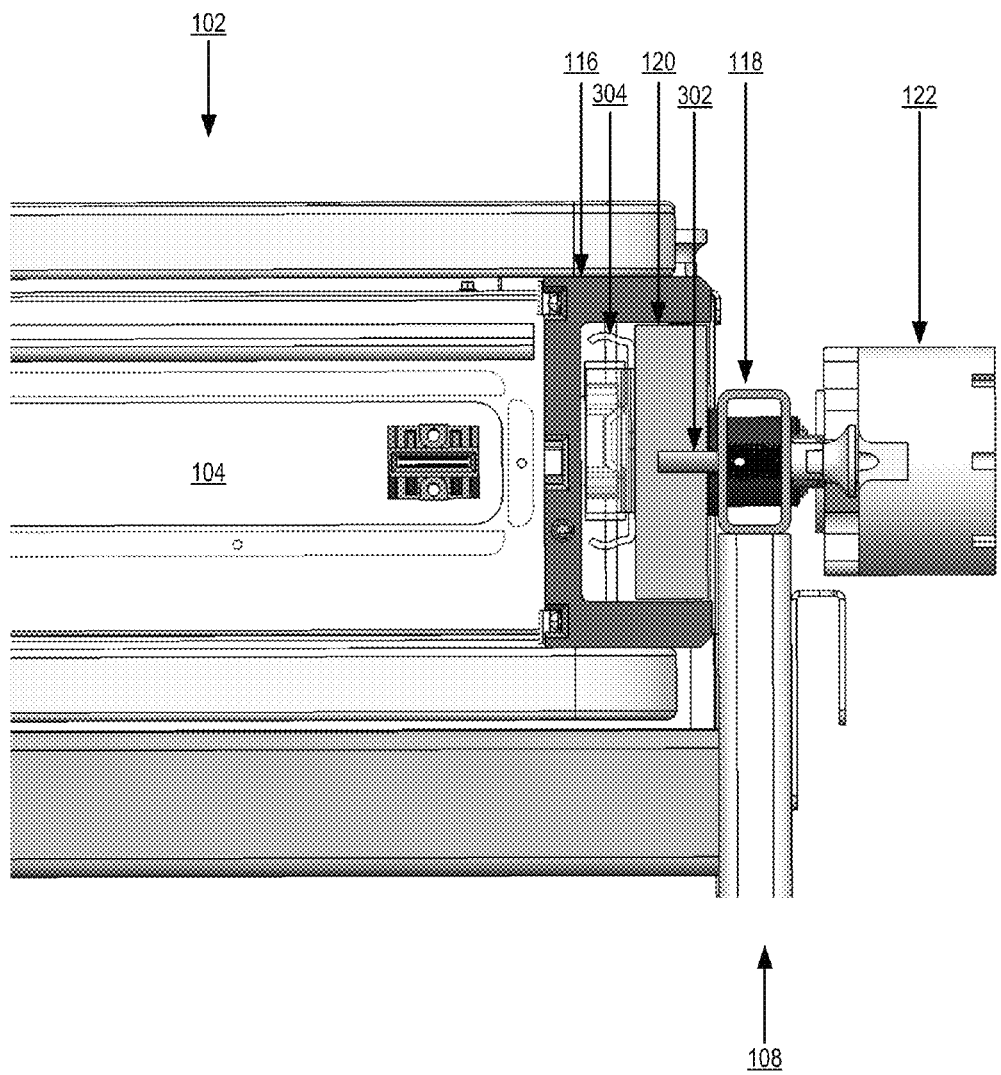
FIG. 3 sets forth a cross-sectional view of a support structure configured for installation of a component assembly housed in a translating, rotating carriage chassis in accordance with embodiments of the present invention.

For further explanation, FIG. 3 sets forth a cross-sectional view of a support structure (108) configured for installation of a component assembly (104) housed in a translating, rotating carriage chassis (102) in accordance with embodiments of the present invention. The support structure (108) in the example of FIG. 3 includes a stationary rail (118), a rotating rail (120) adapted to receive a carriage chassis rail (116), and a translation mechanism (304). The stationary rail (118) in the example of FIG. 3 includes a shaft (302) extruding perpendicular to the stationary rail (118) and into a shaft receptacle of the rotating rail (120).

The support structure (108) in the example of FIG. 3 also includes a rotary damper operatively coupled to the stationary rail (118) and the rotating rail (120). In this example a portion of the rotary damper extrudes through the stationary rail (118)

and a shaft of the rotary damper extrudes into the shaft receptacle of the rotating rail (120). In this example, the shaft of the rotary damper (122) operates as the shaft about which the rotating rail (120) rotates. The rotary damper (122) is configured to control speed of rotation of the rotating rail (120).

The rotating rail (120) is adapted to receive a carriage chassis rail (116). The rotating rail (120) in this example is a non-rotated position and is parallel to the stationary rail (118). The rotating rail (120) is configured to rotate about the shaft (302) and relative to the stationary rail (118).

The translation mechanism in the example of FIG. 3 may be implemented as sliding mechanism with bearings and the like. The translation mechanism (304) in the example of FIG. 3 is attached to the rotating rail (120). The translation mechanism (304) enables the carriage chassis rail (116) to translate parallel to and along the rotating rail (120).

In view of the explanations set forth above, readers will recognize that the benefits of a support structure for installation of a component assembly housed in a translating, rotating carriage chassis according to embodiments of the present invention include:
- providing increased accessibility to all portions of the component assembly, when the assembly is installed in the support structure by means of the carriage housing;
- providing a means by which the component assembly may be coupled and decoupled from power; and
- others as will occur to readers of skill in the art.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A support structure for installation of a component assembly housed in a rotating, translating carriage chassis, the support structure comprising:
    a rotating, translating carriage chassis configured to receive a component card assembly;
    a stationary rail, the stationary rail comprising a shaft extruding perpendicular to the stationary rail;
    a rotating rail adapted to receive a carriage chassis rail, the rotating rail and carriage chassis rail parallel to the stationary rail when the rotating rail is in a non-rotated position, the rotating rail including a shaft receptacle that receives the shaft, the rotating rail configured to rotate about the shaft and relative to the stationary rail;
    a translation mechanism attached to the rotating rail, the translation mechanism enabling the carriage chassis rail to translate parallel to and along the rotating rail, and
    a power connector adapted to couple to the component assembly installed in the carriage chassis and provide power to the component assembly.

2. The support structure of claim 1, further comprising:
    a rotary damper operatively coupled to the stationary rail and the rotating rail, the rotary damper configured to control speed of rotation of the rotating rail.

3. The support structure of claim 1, further comprising:
    a rotation interlock configured to prevent rotation of the rotating rail when the interlock is engaged.

4. The support structure of claim 1, further comprising:
    a translation interlock configured to prevent translation of the carriage chassis rail when the interlock is engaged.

5. The support structure of claim 1, wherein:
    the stationary rail further comprises a rotation limiting member, the rotation limiting member extruding perpendicular to the stationary rail;
    the rotating rail further comprises a channel that receives the rotation limiting member, the channel configured to limit rotation of the rotating rail between a non-rotated position and a final position.

6. The support structure of claim 1, wherein the component card assembly includes a plurality of printed circuit boards.

7. The support structure of claim 6, wherein the component assembly further comprises a liquid-cooled cold plate.

8. The support structure of claim 1, wherein the support structure comprises a test fixture that includes one or more rack slots and testing apparatus.

* * * * *